(12) United States Patent
Geller et al.

(10) Patent No.: US 8,423,332 B2
(45) Date of Patent: Apr. 16, 2013

(54) METHOD FOR SYNTHESIZING NUMERICAL OPERATORS, SYSTEM FOR SYNTHESIZING OPERATORS, AND SIMULATION DEVICE

(75) Inventors: Robert Geller, Tokyo (JP); Hiromitsu Mizutani, Chiba (JP); Nobuyasu Hirabayashi, Yokohama (JP); Nozomu Takeuchi, Tokyo (JP)

(73) Assignee: The University of Tokyo, Bunkyo-ku, Tokyo (JP)

( * ) Notice: Subject to any disclaimer, the term of this patent is extended or adjusted under 35 U.S.C. 154(b) by 139 days.

(21) Appl. No.: 13/129,944

(22) PCT Filed: Nov. 20, 2009

(86) PCT No.: PCT/JP2009/070079
§ 371 (c)(1),
(2), (4) Date: May 18, 2011

(87) PCT Pub. No.: WO2010/058865
PCT Pub. Date: May 27, 2010

(65) Prior Publication Data
US 2011/0224961 A1    Sep. 15, 2011

(30) Foreign Application Priority Data

Nov. 21, 2008  (JP) ................ 2008-298207

(51) Int. Cl.
*G06F 7/60*    (2006.01)
*G06F 17/10*   (2006.01)
(52) U.S. Cl.
USPC .................................... 703/2; 703/10; 702/6
(58) Field of Classification Search ............ 703/2, 9–10; 702/6
See application file for complete search history.

(56) References Cited

PUBLICATIONS

Kole ("Solving seismic wave propagation in elastic media using the matrix exponential approach"., 2003 Elsevier B.V. p. 279-293.*
Geller et al., "Optimally accurate second-order time-domain finite difference scheme for the elastic equation of motion: one-dimensional case," *Geophys. J. Int.*, vol. 135, pp. 48-62, 1998.
Geller et al., "A new method for computing highly accurate DSM synthetic seismograms," *Geophys. J. Int.*, vol. 123, pp. 449-470, 1995.
Takeuchi et al., "Optimally accurate second order time-domain finite difference scheme for computing synthetic seismograms in 2-D and 3-D media," *Physics of the Earth and Planetary Interiors*, vol. 119, pp. 99-131, 2000.
Written Opinion of the International Searching Authority issued in Application No. PCT/JP2009/070079; Dated Dec. 22, 2009.
Hiromitsu Mizuani, Robert J. Geller, Nozomu Takeuchi, "Comparison of Time-Domain Schemes for Calculation of Syntbetic Seismograms," Seismological Society of Japan, Autumn Conference 1998, Oct. 9, 1998, p. 29.
Nozomu Takeuchi, Robert J. Geller, "Supression of numerical dispersion using FD modified operators," the 94th Conference of Society of Exploration Geophysicists of Japan, May 1996, pp. 109-113.
Office action for the equivalent Japanese patent application No. 2008-298207 issued on Jan. 29, 2013.

* cited by examiner

*Primary Examiner* — Eunhee Kim
(74) *Attorney, Agent, or Firm* — Jianguang Du

(57) ABSTRACT

A stiffness matrix H' is designed as $P_i^T C P_i$ or a linear combination form thereof, where a spatial first-order difference operator, which operates on a state vector, of a displacement vector at each discrete grid point is $P_i$ and the matrix of elastic constants is C. The mass matrix T' is derived using finite-difference approximations at the discrete grid points so that the result of the matrix $\delta T^{num}$ operating on a state vector corresponding to rotations or translations is 0, where T is a positive definite diagonal mass matrix and $\delta T^{num} = T' - T$.

15 Claims, 1 Drawing Sheet

मेथड FOR SYNTHESIZING NUMERICAL OPERATORS, SYSTEM FOR SYNTHESIZING OPERATORS, AND SIMULATION DEVICE

TECHNICAL FIELD

The present invention relates to a method for synthesizing numerical operators, a system for synthesizing operators, and a simulation device for a numerical analysis of wave motion in a finite region of an elastic body, which is carried out using a time-domain finite-difference scheme.

BACKGROUND ART

A time-domain finite-difference scheme is used to solve the elastic equation of motion. Stability, computational efficiency, and accuracy are three important problems in a numerical analysis using a time-domain finite-difference scheme. Various methods for computing elastic wavefields using time-domain finite-difference schemes have been developed, but a method of suitably realizing stability, computational efficiency, and optimal accuracy at the same time has not previously been presented.

For example, the time-domain finite-difference scheme disclosed in Non-Patent Document 1 provides a method of calculating an elastic wavefield with high efficiency and high accuracy, but is not guaranteed to be stable.

Here, "high efficiency" means that the computational resources required to obtain a specific computational accuracy are minimized. In particular, it can be said that schemes with a small calculation time and minimal bandwidths of the finite-difference operators used in the calculations have high efficiency. An "optimally accurate scheme" denotes a scheme which requires the minimum amount of computation, as compared to other schemes of the same general type, to achieve a given level of computational accuracy. Hereinafter, an "optimally accurate operator" means an operator satisfying the condition (Equation 9, to be described below), which was disclosed in Non-Patent Document 2.

[Non-Patent Document 1] Takeuchi, N., and R. J. Geller, 2000, Physics of the Earth and Planetary Interiors, 119, 99-131

[Non-Patent Document 2] R. J. Geller, and N. Takeuchi, 1995, Geophysical Journal International, 123, 449-470

[Non-Patent Document 3] R. J. Geller, and N. Takeuchi, 1998, Geophysical Journal International, 135, 48-62.

DISCLOSURE OF THE INVENTION

As described above, in the numerical analysis of wave motions in a finite region of an elastic body, which is carried out using a time-domain finite-difference scheme, previous computational schemes have a problem in that stability, computational efficiency, and accuracy cannot be appropriately realized at the same time.

The invention is contrived to solve the above-mentioned problem. An advantage of the invention is that it provides a method for synthesizing numerical operators, a system for synthesizing operators, and a simulation device, which can appropriately realize stability, computational efficiency, and accuracy at the same time in a numerical analysis of wave motion in a finite region of an elastic body which is carried out using a time-domain finite-difference scheme.

According to an aspect of the invention, there are provided a method and a system, for synthesizing operators used in a predictor step and a corrector step on the basis of the following equation, which is an implicit finite-difference approximation of the elastic equation of motion, for a numerical analysis of wave motion in a finite region of an elastic body which is carried out using a time-domain finite difference method employing a predictor-corrector scheme, $$T' \frac{1}{\Delta t^2}(c_+ - 2c_0 + c_-) = -\frac{H'}{12}(c_+ + 10c_0 + c_-) + f,$$

(where $\Delta t$ denotes the time step, $c_+$, $c_0$, and $c_-$ denote state vectors that give the components of the displacement vectors at discrete grid points in the analysis target space at times $t+\Delta t$, $t$, and $t-\Delta t$, respectively, $f$ denotes the external force vector at each discrete point, T' denotes a mass matrix, and H' denotes a stiffness matrix), the method or system comprising the step/means of generating the operators H' and $\delta T^{num}$ (where T is a positive definite diagonal mass matrix introduced by difference approximation at the discrete grid points) expressed by $\delta T^{num} = T' - T$, wherein H' is generated from spatial first-order difference operators $P_i$ (where i is an integer in the range of $1 \leq i \leq I$ and I is a natural number that depends on the dimensionality of the analysis target space), which operates on the state vector, of the displacement vector at each discrete grid point, and an elastic constant matrix C on the basis of the following equation, $$H' = \sum_i a_i P_i^T C P_i,$$

(where $a_i$ is a positive scalar coefficient, the operator $P_i^T$ is an matrix operator expressed as a transposed matrix operator $P_i$), and wherein $\delta T^{num}$ is specified so that the operation result of the operator $\delta T^{num}$ on the state vectors corresponding to rigid body rotations and translations is 0.

According to an aspect of the invention, there are provided a simulation device for carrying out a numerical analysis of wave motion in a finite region of an elastic body using a time-domain finite difference method employing a predictor-corrector scheme, a simulation device comprising computational means for calculating a predictor step and a corrector step on the basis of the following equation which is an implicit finite-difference approximation of the equation of motion using a positive definite diagonal mass matrix T introduced by a difference approximation at the discrete grid points and an operator $\delta T^{num}$ expressed by $\delta T^{num} = T' - T$, $$T' \frac{1}{\Delta t^2}(c_+ - 2c_0 + c_-) = -\frac{H'}{12}(c_+ + 10c_0 + c_-) + f,$$

(where $\Delta t$ denotes the time step, $c_+$, $c_0$, and $c_-$ denote state vectors including components of displacement vectors at discrete grid points set in an analysis target space at times $t+\Delta t$, $t$, and $t-\Delta t$, respectively, $f$ denotes the external force vector at each discrete grid point, T' denotes a mass matrix, and H' denotes a stiffness matrix), the predictor being expressed by the following equation $$T \frac{1}{\Delta t^2}(\tilde{c}_+ - 2c_0 + c_-) = -H' c_0 + f,$$

the corrector being expressed by the following equation $$T \frac{1}{\Delta t^2}\delta c_+ = -\frac{H'}{12}(\tilde{c}_+ - 2c_0 + c_-) - \delta T^{num} \frac{1}{\Delta t^2}(\tilde{c}_+ - 2c_0 + c_-).$$

and sequentially generating the state vector $c_+$ expressed by the following equation, $$c_+ = \tilde{c}_+ + \delta c_+.$$

wherein H' is an operator expressed by the following equation from a spatial first-order difference operator $P_i$ (where i is an integer in the range of $1 \leq i \leq 1$ and I is a natural number which depends on the dimensionality of the analysis target space), which operates on the state vectors, of the displacement vector at each discrete point and an elastic constant matrix C, $$H' = \sum_i a_i P_i^T C P_i,$$

(where $a_i$ is a positive scalar coefficient, the operator $P_i^T$ is a matrix operator expressed as a transposed matrix operator $P_i$), and wherein the operator $\delta T^{num}$ is an operator designed so that the operation result of the operator $\delta T^{num}$ on the state vectors corresponding to rigid body rotations and translations is 0.

This invention makes it is possible to obtain an operator and a simulation device, which can appropriately realize stability, computational efficiency, and optimal accuracy at the same time in a numerical analysis of wave motions in a finite region of an elastic body which is carried out using a time-domain finite-difference scheme.

BEST MODE FOR CARRYING OUT THE INVENTION

Figure 1:
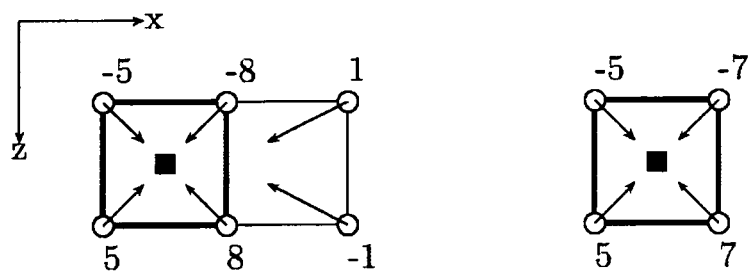
FIG. 1 is a diagram schematically illustrating a stencil for explaining one part of the method for computing the product of a matrix in a $P^T CP$ form and a state vector u for a two-dimensional case.

Hereinafter, an embodiment of the invention (hereinafter, referred to as "this embodiment") will be described.

A computer system comprising an embodiment of the invention includes a computation unit, a storage unit, an input unit, and an output unit and is used, for example, for seismic wave analysis. The computation unit is a central processing unit (CPU) and executes various programs. Specifically, the computation unit performs an operator generating process based on an operator generating method to be described below and performs a simulation using an operator generated in the process. Accordingly, the computer system embodies the operator generator and the simulation device according to the invention. The computation unit controls the respective elements of the computer system.

The storage unit stores various programs executed by the computation unit. The storage unit is also used as a work area for executing the programs and temporarily stores data in the calculation process. The storage unit stores operators obtained as the result of the operator generation process, and also stores the analysis results of each time step obtained from a time-evolutional simulation.

The input unit includes a keyboard and a mouse. A user operates the input unit to set various parameters used in the operator generating process or the simulation by the computation unit.

The output unit includes a printer and a display and serves, for example, to print out the generated operators or to display the simulation result in a graphic.

The operator generating method, the operator generator, and the simulation device according to this embodiment are associated with a numerical analysis of wave motion in a finite region of an elastic body which is carried out using a time-domain finite-difference scheme.

Here, the operator generating method, the operator generator, and the simulation device are associated with each other. That is, the operator generating method is a method of generating an operator corresponding to the numerical analysis process using the time-domain finite-difference scheme carried out by the simulation device. The operator generator generates the operators by performing the operator generating method. The simulation device carries out the numerical analysis using the generated operators. Accordingly, it is desirable that the operator generation and the simulation according to the invention should be described in one calculation scheme to easily understand the details. Therefore, an elastic wave analyzing scheme including the details of the operator generation and the simulation according to the invention will be described now.

Equation of Motion

The equation of motion of elastic wave propagation in an elastic body which is subjected to the simulation according to the invention is expressed by the following equation.

$$\rho \frac{\partial^2 u_i}{\partial t^2} = (C_{ijkl} u_{k,l})_{,j} + f_i, \quad (1)$$

Here, $\rho$ denotes the density, $C_{ijkl}$ denotes the tensor of elastic constants, and $u_i$ denotes a displacement vector, where the subscripts i, j, k, and l are one of x, y, and z and denote components in the axis directions in an xyz orthogonal coordinate system of a three-dimensional space. $u_{i,j}$ denotes differentiation (j=x, y, z) of $u_i$ in the j direction. $f_i$ denotes the component in the i direction of the external force vector. This equation uses Einstein's summation rule. In addition, the rule is appropriately used in the equations presented below.

One-Step Implicit Finite-Difference Approximation

In the analysis using the time-domain finite-difference scheme, the equation of motion is discretized using an optimally accurate calculation scheme. The following equation which is an implicit finite-difference approximation of the equation of motion can be obtained by the discretization.

$$T' \frac{1}{\Delta t^2}(c_+ - 2c_0 + c_-) = -\frac{H'}{12}(c_+ + 10c_0 + c_-) + f, \quad (2)$$

Here, $\Delta t$ denotes a time step. $c_+$, $c_0$, and $c_-$ denote state vectors including components of displacement vectors at discrete grid points set in an analysis target space at times $t+\Delta t$, t, and $t-\Delta t$, respectively. f denotes the external force vector at the discrete points, T' denotes a mass matrix, and H' denotes a stiffness matrix.

To ensure the stability of the discretized scheme in time evolution, it is a necessary condition that T' is positive definite and H' is non-negative definite. Here, when H' can be expressed by the following equation, it satisfies the non-negative definiteness.

$$H' = P^T C P, \quad (3)$$

Here, P denotes the difference approximation of a spatial first-order differentiation in the equation of motion and the superscript T denotes a transposed matrix. C denotes the elastic constant matrix of the analysis target space (including heterogeneity and anisotropy). H', which is described on the right side of Equation 3 and is a linear combination of the non-negative definite operators expressed by the following equation, also satisfies the non-negative definiteness condition.

$$H' = \sum_i a_i P_i^T C P_i, \quad (4)$$

Here, i is i=1, ..., I (where I is an integer), $a_i$ is a positive coefficient, and $P_i$ denotes a first-order spatial difference operator.

Predictor-Corrector Scheme

The implicit formulation is not suitable for the processes performed by the computer system without any change, and a simulation is actually conducted by the computer system using a predictor-corrector scheme. In the predictor-corrector scheme, a predictor step and a corrector step are each solved explicitly using Equation 2. Equations 5 and 6 below respectively define the predictor step and the corrector step.

$$T \frac{1}{\Delta t^2}(\tilde{c}_+ - 2c_0 + c_-) = -H' c_0 + f, \quad (5)$$

$$T \frac{1}{\Delta t^2} \delta c_+ = -\frac{H'}{12}(\tilde{c}_+ - 2c_0 + c_-) - \delta T^{num} \frac{1}{\Delta t^2}(\tilde{c}_+ - 2c_0 + c_-). \quad (6)$$

Here, T is a diagonal mass matrix and $\delta T^{num}$, the residual of the mass matrix, is given by the following equation.

$$T' = T + \delta T^{num} \quad (7)$$

The first term in the parenthesis of the left side in Equation 5 is the state vector $c_+$ at time $t+\Delta t$ as given by the predictor step. In the simulation, the value of $c_+$ is calculated from known state vectors $c_0$ and $c_-$ by the predictor step. Then, a correction $\delta c_+$ to the predicted value is calculated using the corrector step. Then, as expressed by the following equation, the results obtained by the predictor step and the corrector step are summed to obtain the state vector $c_+$ of the next time step.

$$c_+ = \tilde{c}_+ + \delta c_+. \quad (8)$$

Realization of Stability

To guarantee the stability of the predictor-corrector scheme, $\delta T^{num} = T' - T$ is designed to satisfy the following conditions: that the operation result on an eigenvector corresponding to rigid body translations and rotations (for which the eigenfrequency of the original continuous equation of motion is 0) is 0, and the condition that the operator T' is positive definite.

The operator generating method and the operator generator according to the invention generate the operators H' and $\delta T^{num}$ used in Equations 5 and 6 so as to satisfy the condition for $\delta T^{num}$ and the conditions of Equation 3 or 4. A simulation employing the predictor-corrector scheme is carried out using the generated operators H' and $\delta T^{num}$, whereby stability is guaranteed.

Realization of Optimal Accuracy

Although the generation of the operators for realizing the stability of the simulation has been described, the generation of an operator which realizes "optimal accuracy" in addition to stability will now be described.

The mass matrix and the stiffness matrix of the theoretically exact operators are defined as $T^0$ and $H^0$ and the residuals of the numerical operators are defined as follows.

$$\delta T = T' - T^0$$

$$\delta H = H' - H^0$$

The eigenvector of the exact equation of motion is $u_m$ (where m is the identifying index of an eigenmode), the eigenfrequency corresponding to $u_m$ is $\omega_m$, and the diagonal components of the matrix elements of $\delta T$ and $\delta H$ with respect to the m-th eigenvector are defined as $\delta T_m$ and $\delta H_m$.

The condition for T' and H' to be optimally accurate operators as defined in Non-Patent Document 2 is that the following equation must be satisfied with second or higher order accuracy of the spatial difference step.

$$\omega_m^2 \delta T_{mm} - \delta H_{mm} \approx 0, \quad (9)$$

To obtain an operator satisfying these conditions, the first-order difference operators in the discretized equation of motion are designed as follows. $D_x$, $D_y$, and $D_z$ denote two-point first-order difference operators in the x, y, and z axis directions, evaluated at points referred to below as the "differentiation defining positions." $E_x^r$, $E_y^s$, and $E_z^t$ denote second-order-accuracy zeroth order difference operators designed to have the optimal accuracy by three-point difference approximation in the x axis direction, the y axis direction, and the z axis direction at the differentiation defining positions. Here, r, s, and t are 1 or 2 and are indexes representing the difference in alignment of the three discrete points used in the three-point difference approximation from the differentiation defining positions. For example, r=1 represents an alignment in which three discrete points are shifted in the negative x axis direction and r=2 represents the alignment in which three discrete points are shifted in the positive direction. Here, the coordinates of the center points in the x, y, and z axis directions of the discrete points are $x_c$, $y_c$, and $z_c$ and the interval between the discrete points is h. For example, when the coordinate of the differentiation defining position is ($x_c$, $y_c$, and $z_c$), r=1 specifically represents the alignment in which the x coordinate of the center point of three discrete points is $x_c - h/2$, and r=2 represents the alignment in which the x coordinate of the center point is $x_c + h/2$. The same is true for the other indices s and t.

The first-order difference operators $D_x^{rst}$, $D_y^{rst}$, and $D_z^{rst}$ are defined by the following equation using $D_x$, $D_y$, $D_z$, $E_x^r$, $E_y^s$, and $E_z^t$.

$$D_x^{rst} = E_z^t(E_y^s D_x) \quad (10)$$

$$D_y^{rst} = E_x^r(E_z^t D_y) \quad (11)$$

$$D_z^{rst} = E_y^s(E_x^r D_z), \quad (12)$$

In addition, for example, the difference operator $D_x^{rst}$ is the difference approximation of first-order differentiation obtained by smearing out $D_x$ in two axis directions other than the x axis which is the differentiation direction, that is, in the directions of both the y axis and the z axis. The same is true in $D_y^{rst}$ and $D_z^{rst}$.

For example, the equations in the first row and the second row of Equations 13 and 14 (below) express the specific forms of $E_x^1$ and $E_x^2$ in the above equation where the specific forms are applied to an arbitrary continuous function f at a grid point. $E_y^s$ and $E_z^t$ have the same specific forms.

$$E_x^1(f) = \frac{1}{12}\left(\begin{array}{c} -f(x_c - 3h/2, y, z) + 8f(x_c - h/2, y, z) + \\ 5f(x_c + h/2, y, z) \end{array}\right) n_x \neq 1 \quad (13)$$

$$= \frac{1}{12}(7f(x_c - h/2, y, z) + 5f(x_c + h/2, y, z)) \ n_x = 1$$

$$\approx f(x_c, y_c \cdot z_c) + \frac{\Delta x^2}{24} \frac{\partial^2 f}{\partial x^2} + \ldots.$$

-continued $$E_x^2(f) = \frac{1}{12}\left(\begin{array}{c}5f(x_c - h/2, y, z) + 8f(x_c + h/2, y, z) - \\ f(x_c + 3h/2, y, z)\end{array}\right) n_x \neq N_x \quad (14)$$

$$= \frac{1}{12}(5f(x_c - h/2, y, z) + 7f(x_c + h/2, y, z)) \; n_x = N_x$$

$$\approx f(x_c, y_c \cdot z_c) + \frac{\Delta x^2}{24}\frac{\partial^2 f}{\partial x^2} + \dots \; .$$

The equations of the third row of Equations 13 and 14 represent the results of the Taylor expansion of the equations of the first and second rows. $E_x^r$, $E_y^s$, and $E_z^t$ are derived by adding the second order differentiation components (the second term of the Taylor expansion) having a specific coefficient to the zeroth order differentiations (the first term of the Taylor expansion), whereby the optimal accuracy condition expressed by Equation 9 is satisfied.

When the optimal accuracy condition is satisfied, the difference operator $P_i$ in Equation 4 is determined to correspond to 8 combinations ($2^3$ combinations) of r, s, and t using $D_x^{rst}$, $D_y$rst, and $D_z^{rst}$. That is, I in Equation 4 is 8 and i is an integer satisfying $1 \leq i \leq I$. In addition, $a_i$ is ⅛.

Specifically, $P^{rst}$ is i defined by the following quadratic form using arbitrary vectors v and w.

$$v^T H' w = 1/32 \sum_{r,s,t} \sum_{\alpha} (D_i^{rst} v_j + D_j^{rst} v_i)^{(\alpha)} C_{ijkl}^{(\alpha)} (D_k^{rst} w_l + D_l^{rst} w_k)^{(\alpha)} \quad (15)$$

$$= 1/8 \sum_{r,s,t} v^T ((P^{rst})^T C P^{rst}) w$$

Here, $P^{rst}$ is a first-order difference operator in which combinations of $D_i^{rst}$ (where i=x, y, z) are expressed in a matrix, and is numbered and correlated with $P_i$ depending on the combinations of r, s, and t.

In case of two dimensions (the P-SV problem and the SH problem) (when the analysis target space is the xz plane), the difference operators $D_x^{rs}$ and $D_z^{rs}$ corresponding to $D_x^{rst}$, $D_y^{rst}$ and $D_z^{rst}$ in case of three dimensions are defined by the following equation. Here, r and s are indices corresponding to r and t in case of three dimensions and values thereof are 1 or 2.

$$D_x^{rs} = E_z^s(D_x) \quad (16)$$

$$D_z^{rs} = E_x^r(D_z), \quad (17)$$

For example, the difference operator $D_x^{rs}$ is the first-order difference operator obtained by smearing out $D_x$ in one axis direction other than the x axis direction which is the differentiation direction, that is, in the z axis direction. The same is true for $D_z^{rs}$.

When the optimal accuracy condition is satisfied, the operator $P_i$ in Equation 4 is determined to correspond to 4 combinations ($2^2$ combinations) of r and s using $D_x^{rs}$ and $D_z^{rs}$. That is, in case of two dimensions, the upper limit I of the integer i satisfying is $1 \leq i \leq I$. In addition, $a_i$ is ¼.

Specifically, $P^{rs}$ in case of two dimensions is defined by the following equation.

$$v^T H' w = 1/16 \sum_{r,s} \sum_{\alpha} (D_i^{rs} v_j + D_j^{rs} v_i)^{(\alpha)} C_{ijkl}^{(\alpha)} (D_k^{rs} w_l + D_l^{rs} w_k)^{(\alpha)} \quad (18)$$

$$= 1/4 \sum_{r,s} v^T ((P^{rs})^T C P^{rs}) w$$

Here, $P^{rs}$ is a first-order difference operator in which combinations of $D_i^{rs}$ (where i=x, z) are expressed in a matrix, and is numbered and correlated with $P_i$ depending on the combinations of r and s.

By setting a state vector on which this operator acts to have only the displacement of the y component, the SH problem is defined. By setting the state vector to have only the x and z components, the P-SV problem is defined.

As described above, by expressing H' as the sum of operators defined by various $P_i$, the existence of an eigenmode in which an eigen-frequency is 0 other than translation and rotation modes is eliminated when the generalized eigenvalue problem for the numerical operators is solved.

Suppression of Non-Physical Phenomenon

When the simulation is carried out using the above-defined H', the phenomenon of high-wavenumber waves having a component vibrating at every spatial grid point with a low frequency may occur in both two-dimensional and three-dimensional analyses. Physically speaking, it is natural for a high-wavenumber (short-wavelength) wave to have a higher frequency; the above-mentioned phenomenon is thus a non-physical phenomenon. An operator for suppressing this phenomenon will be described below.

To suppress the non-physical phenomenon, an operator Q is designed using a three-point second-order difference operator in the i axis (where i=x, y, z) direction defined as $F_i^r$, and the above-mentioned H' is corrected as follows. Here, r is an index indicating the shift direction of the discrete point alignment defining the difference operator, as in the definition of the above-mentioned $E_x^r$, and the value thereof is 1 or 2.

$$H' = \sum_i a_i P_i^T C P_i + \sum_j \epsilon_j Q_j^T C Q_j, \quad (19)$$

Here, j=1, . . . , J (where J is a natural number which depends on the dimensionality of the problem) and $\epsilon_j$ is a positive coefficient. $Q_j$ is a second-order difference operator corresponding to j. Equation 19 is common to the two-dimensional and three-dimensional problems. The specific equations of $F_i^r$, $Q_j$, and $\epsilon_j$ will be described later.

Hitherto, the stiffness matrix H' which is stable and suitable for the optimal accuracy condition and suppresses the excitation of the non-physical phenomenon is completely defined.

Definition of Mass Matrix

A positive definite mass matrix T' which is stable and satisfies the condition for optimal accuracy will be described now. The mass matrix T' satisfying the optimal accuracy condition is expressed by the following equation in the same form as Equation 7 using the diagonal mass matrix T used in calculating the predictor step and the residual $\delta T^{num}$.

$$T' = T + \delta T^{num} \quad (20)$$

As described above, to ensure the stability of the predictor-corrector scheme, the result of $\delta T^{num}$ when it operates on the translation and rotation modes must be 0, as is also the case for the discretized stiffness matrix H'. To satisfy this condition and also satisfy the optimal accuracy condition, or $\delta T^{num}$ is defined as follows using the equation of H'.

$$\delta T^{num} = \sum_i a_i P_i^T X P_i + \sum_j \epsilon_j Q_j^T X Q_j \quad (21)$$

The right hand side of this equation is obtained by replacing the elastic constant matrix C in the equation of the stiffness matrix by X, where X is a matrix defined using the density and the grid interval $\Delta x_a$ (where a is one of x, y, and z) so as to satisfy the optimal accuracy condition and is given by the following equation.

$$X^{(\alpha)}_{abcd} = -\frac{\rho^{(\alpha)}(\delta_{ab}\delta_{cd})(\Delta x_a)^2}{12}, \quad (22)$$

Here, $\rho^{(\alpha)}$ is a value of the density at the α-th differentiation defining point, $\delta_{ab}$ and $\delta_{cd}$ are Kronecker deltas, and a, b, c, and d are subscripts which can each corresponding to the coordinate axes x, y, or z.

In this way, the stiffness matrix H' and the mass matrix T' (and $\delta T^{num}$) can be derived to obtain a stable predictor-corrector scheme with the optimal accuracy.

By carrying out a time-evolutional computation using the above-mentioned operators and the predictor-corrector scheme, it is possible to calculate a displacement field which can be expressed by the state vector at an arbitrary point in a temporal grid and a spatial grid.

Improvement of Computational Efficiency in Simulation

The largest computational load in the predictor-corrector scheme results from the spatial differencing using T' and H'. By carrying out the spatial difference computation in the following order, it is possible to improve the computational efficiency at the time of carrying out the simulation.

As described above, H' and T' include the product of matrices in the same form as Equation 3. For example, in the computation in which the operator expressed by Equation 3 operates on a state vector, it is necessary to continuously and efficiently perform the following three steps. Step 1: computing a product of the difference matrix operator P and the state vector u corresponding to the value of displacement at the grid points; Step 2: multiplying the results of step 1 by the elastic constants for each element; Step 3: multiplying the results of step 2 by $P^T$, which is the transposed matrix of the difference operator. The elastic constants are defined at the same positions as the results of the differencing operations.

When the displacements at the three-dimensional grid points are written as a one-dimensional vector $u_j$ in the same way as done by a typical finite element scheme and the elements of P are $P_{ij}$, the computation of step 1 is given by the following equation:

$$v_i = \sum_j P_{ij} u_j \quad (23)$$

Here, $u_i$ is a vector defined as the values at the grid points and $v_i$ is a vector obtained by one-dimensionally numbering and aligning the computation results at the differentiation defining position. In Equation 23, the values of $u_j$ around the differentiation defining position i are multiplied by a weight defined by $P_{ij}$ and the multiplication results are summed, to calculate $v_i$ at the differentiation defining position i. FIG. 1 is a diagram schematically illustrating a stencil for explaining the compitation of Equation 23 in the two-dimensional case. In FIG. 1, white circles (○) represent the grid points and black rectangles (■) represent the differentiation defining positions. The numerical values described around the grid points are $P_{ij}$. In general, six grid points may exist for each differentiation defining position as shown in FIG. 1(a), but when the differentiation defining position is adjacent to the boundary of the analysis target space, a stencil including four points may be used as shown in FIG. 1(b).

The computation of step 2 is a simple scalar multiple and thus does not any special handling.

The computation of step 3 is expressed by the following equation.

$$w_k = \sum_j P_{jk} v_j \quad (24)$$

$$= \sum_j w_k^{(j)}$$

Figure 2:
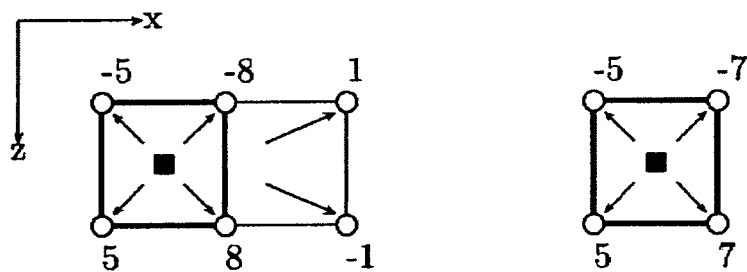
FIG. 2 is a diagram schematically illustrating a stencil for explaining the second part of the method for computing a product of a matrix in a $P^T CP$ form and a state vector u for a two-dimensional case.

In Equation 24, $w_k$ is a vector representing the computation results at the grid point. In Equation 24, $w_k^{(j)} = P_{jk} v_j$ is set. Here, $w_k^{(j)}$ is calculated by distributing the value of the j-th differentiation defining point of the vector expressed by $v_j$ to the k-th grid point. That is, $v_j$ of the right side is a vector defined by the value at the differentiation defining position as described above, but $w_k$ is a vector representing the computation result at a grid point (similarly to $u_i$). FIG. 2 is a diagram schematically illustrating a stencil for explaining the computation of Equation 24 in the two-dimensional case. In FIG. 2, similarly to FIG. 1, white circles (○) represent the grid points and black rectangles (■) represent the differentiation defining positions. The numerical values described around the grid points are $P_{ij}$. The stencil difference between FIGS. 2(a) and 2(b) is the same as FIG. 1.

By repeatedly performing the computations of steps 1 to 3 for all the differentiation defining positions, all the matrix computations are completed. According to this calculation method, the computation of the product of a very large matrix and a vector can be efficiently performed by a partial sum of computations.

Specific Equation for Q

The specific forms of $F_i^r$, $Q_j$, and $\epsilon_i$ will be described below. The three-dimensional case is described first and then the two-dimensional case is described.

First, the second-order difference operator $F_i^r$ is defined using the discretization of a continuous function f, similarly to the definition of the zeroth order difference operator. The specific form of $F_x^1$ is expressed by the following equation.

$$F_x^1(f) = \begin{pmatrix} -f(x_c - 3h/2, y, z) + 2f(x_c - h/2, y, z) - \\ f(x_c + h/2, y, z) \end{pmatrix} n_x \neq 1 \quad (25)$$

$$= (-f(x_c - h/2, y, z,) + f(x_c + h/2, y, z)) \; n_x = 1$$

$$\approx -f''(x_c, y \cdot z)\Delta x^2 + \dots$$

The other $F_i^r$ is defined in the same way. By replacing $D_i^{rst}$ in the defining equation of $P^{rst}$ expressed by Equation 15 with the following six patterns using the definition of $F_i^r$ and extracting the part corresponding to $P^{rst}$, $Q_j^{rst}$ is defined.

$$j=1 \; (D_x^{rst} D_y^{rst} D_z^{rst}) \rightarrow (0 \; F_x^r D_y E_z^t \; F_x^r E_y^s D_z) \quad (26)$$

$$j=2 \; (D_x^{rst} D_y^{rst} D_z^{rst}) \rightarrow (D_x F_y^s E_z^t \; 0 \; E_x^r F_y^s D_z) \quad (27)$$

$$j=3 \; (D_x^{rst} D_y^{rst} D_z^{rst}) \rightarrow (D_x E_y^s F_z^t \; E_x^r D_y F_z^t \; 0) \quad (28)$$

$$j=4 \; (D_x^{rst} D_y^{rst} D_z^{rst}) \rightarrow (D_x F_y^s F_z^t \; 0 \; 0) \quad (29)$$

$$j=5 \; (D_x^{rst} D_y^{rst} D_z^{rst}) \rightarrow (0 \; F_x^r D_y F_z^t \; 0) \quad (30)$$

$$j=6 \; (D_x^{rst} D_y^{rst} D_z^{rst}) \rightarrow (0 \; 0 \; F_x^r F_y^s D_z) \quad (31)$$

The elements $H^{rst}$ of the stiffness matrix are defined as follows using the second order difference operator $Q_j^{rst}$ generated by the replacement of six patterns.

$$H'^{rst} = H^{rst} + \frac{5}{144}[(Q_1^{rst})^T CQ_1^{rst} + (Q_2^{rst})^T CQ_2^{rst} + (Q_3^{rst})^T CQ_3^{rst}] + \left(\frac{5}{144}\right)^2 [(Q_4^{rst})^T CQ_4^{rst} + (Q_5^{rst})^T CQ_5^{rst} + (Q_6^{rst})^T CQ_6^{rst}] \quad (32)$$

Finally, the stiffness matrix H' is calculated by the following equation.

$$H' = \frac{1}{8}\sum_{r,s,t} H^{rst} \quad (33)$$

In this equation, $\epsilon_j = 5/144$ is used for j=1, 2, and 3, and $\epsilon_j = (5/144)^2$ is used for j=4, 5, and 6. Values of 5/144 or greater maybe used, but the time step $\Delta t$ must be smaller in this case and thus 5/144 is the most appropriate value.

The equation of the second order difference operator $Q_j^{rs}$ in the two-dimensional case can be calculated, similarly to the three-dimensional case, by replacing $D_i^{rs}$ in the defining equation of $P^{rs}$ expressed by Equation 18 as follows and extracting the operator corresponding to $P^{rs}$ therefrom.

$$j=1 \ (D_x^{rs} D_z^{rs}) \rightarrow (D_x F_z^s \ 0) \quad (34)$$

$$j=2 \ (D_x^{rs} D_z^{rs}) \rightarrow 0 \ F_x^r D_z) \quad (35)$$

The elements $H^{rs}$ of the stiffness matrix in the two-dimensional case are defined using the second order difference operator $Q_j^{rs}$ formed therefrom.

$$H'^{rs} = H^{rs} + \frac{5}{144}[(Q_1^{rs})^T CQ_1^{rs} + (Q_2^{rs})^T CQ_2^{rs}], \quad (36)$$

In the above equation, $\epsilon_j = 5/144$ (where j=1, 2) is used. However, when $\epsilon_j$ is 4/144 or greater in the two-dimensional case, it is possible to suppress the non-physical phenomenon. Finally, the stiffness matrix H' is expressed by the following equation using the stiffness matrix elements $H^{rs}$.

$$H' = \frac{1}{4}\sum_{r,s} H^{rs} \quad (37)$$

Applications of Calculation Scheme

In this calculation scheme, all the matrices can be defined if the elastic constants (including anisotropy) and the density are specified at each differentiation defining point. A heterogeneous structure can be realized by specifying heterogeneous values of the elastic constants and the value of the density at each differentiation defining point, and surface topography can be introduced by setting the elastic constants and the density of air to 0.

The evolution of the displacement field at successive time steps is updated using an explicit scheme. The maximum value of the time step At can be determined using the maximum eigenvalue of the corresponding generalized eigenvalue problem. This is a known method and thus is not described in detail herein.

The stable spatial difference operators with optimal accuracy defined by the above-mentioned operator generating method may be used in combination with known schemes for absorbing boundary conditions. Therefore, such methods are also included in the scope of applicability of the operator generating method, the operator generator, and the simulation device of the invention.

The stable spatial difference operators with optimal accuracy defined as described above may be used in combination with one of the various known schemes for representing an elastic attenuation. This scheme is also included in the scope of the invention.

In the invention, only schemes for the three-dimensional and two-dimensional problems are treated. This is because the one-dimensional case is equivalent to the scheme defined in Non-Patent Document 3.

The category of time-domain finite-difference schemes includes (a) "one step schemes," which calculate the time evolution of the wavefield using discretization on a regular grid, with displacement (or velocity or acceleration) as dependent variables; and (b) "staggered grid schemes," which calculate the time evolution of the wavefield using discretization on two types of grids with a deviation of a half grid width and using the displacement (or velocity or acceleration), and the stress as dependent variables". A scheme of type (a) has been described above, but the spatial difference operators used in the invention may also be applied to the schemes of type (b). That is, the stability is guaranteed by calculating the time evolution using P (or $P^T$) for the spatial differencing of the displacement (or the velocity or acceleration) and using $P^T$ (or P) for the spatial differencing of the stress. As described in Non-Patent Document 3, since the predictor-corrector scheme cannot be applied to this scheme, optimal accuracy cannot be obtained, but stability can be realized by calculating the time evolution using only the predictor step.

The number of grid points in the analysis target space is generally very large and, the size of the discretized operator expressed in matrix form is thus also generally very large. If such a large matrix operator is explicitly generated and stored in the storage unit, or if such a large matrix stored in the storage unit is directly multiplied by a large state vector, the required computational effort will be extensive. The invention avoids the need for such computational effort through the approach shown schematically in FIGS. 1 and 2. The simulation device for implementing the invention makes the calculation by allowing the operator matrix to operate on the state vector for each part of the analysis target space, and then summing these results. The operator generating method and the operator generator defined by the invention include a method of generating successive portions of the operators which are sequentially provided to the simulation device as required.

The operators H' and $\delta T^{num}$ can be expressed in the form of the product of the operators (matrices) as described above. In this case, the generation of an operator is not limited to the explicit calculation of the matrix elements of the matrix H' or the matrix $\delta T^{num}$, but may instead include the calculation of the elements of the operator matrices to be multiplied. For example, in the method described with reference to FIGS. 1 and 2, the matrix elements of the first-order difference operators $P_i^T$ and $P_i$ in the product $P_i^T CP_i$ of the matrices constituting H' are directly and specifically determined, but the explicit values of the matrix elements of H' are not explicitly calculated and stored when the invention generates the operators. However, in this case, H' is defined by Equation 4 using $P_i^T$ and $P_i$ and in this sense it can be said that H' is generated.

Industrial Applicability

The operator generating method, the operator generator, and the simulation device according to the invention can be used in a seismic wave analysis. When sufficient information from recordings of seismic waves propagated through the earth's interior can be obtained, it is possible to obtain more detailed and accurate models of earth structure. The ability to determine accurate and high resolution models of the earth's interior can be applied, for example, in geophysical exploration for the development of oilfields or for amelioration of earthquake risk.

The invention claimed is:

1. A method for processing seismic data, the method comprising:

synthesizing numerical operators for conducting a numerical analysis of seismic wave motion propagated in a finite region defined by an interior section of the earth using a time-domain finite-difference method employing a predictor-corrector scheme to solve the following implicit finite-difference equation $$T' \frac{1}{\Delta t^2}(c_+ - 2c_0 + c_-) = -\frac{H'}{12}(c_+ + 10c_0 + c_-) + f,$$

(where $\Delta t$ denotes a time step, $c_+$, $c_0$, and $c_-$ denote state vectors (which give components of the displacement vector at discrete grid points in an analysis target space) at times $t+\Delta t$, $t$, and $t-\Delta t$, respectively, f denotes an external force vector at each discrete grid point, T' denotes a mass matrix, and H' denotes a stiffness matrix), which synthesizes operators H' and $\delta T^{num}$ (where T is a positive definite diagonal mass matrix) given by $\delta T^{num} = T' - T$, the residual of the mass matrix, wherein H' is generated using a spatial first-order difference operator $P_i$ (where i is an integer in the range of $1 \leq i \leq I$ and I is a natural number which depends on a dimensionality of the analysis target space), which operates on the state vectors at each discrete grid point and an elastic constant matrix C on the basis of the following equation, $$H' = \sum_i a_i P_i^T C P_i,$$

(where $a_i$ is a positive scalar coefficient, the operator $P_i^T$ is a transposed matrix operator of $P_i$), and wherein $\delta T^{num}$ is defined so that an operation result of the operator $\delta T^{num}$ on the state vectors corresponding to rotations and translations is 0;

receiving the seismic data; and using the synthesized numerical operators to carry out the numerical analysis and to produce a model of the interior section of the earth.

2. The method according to claim 1, wherein the analysis target space is a three-dimensional space having an x axis, a y axis, and a z axis as coordinate axes, and wherein when two-point first-order difference operators in the x axis direction, the y axis direction, and the z axis direction at differentiation defining positions are $D_x$, $D_y$, and $D_z$, second-order-accuracy zeroth order difference operators designed to have optimal accuracy at the differentiation defining positions by using three-point difference approximations in the x axis direction, the y axis direction, and the z axis direction are $E_x^r$, $E_y^s$, and $E_z^t$ (where r, s, and t are 1 or 2 and denote types of the operators depending on a difference in location of the three discrete grid points used in the difference with respect to the differentiation defining positions), and first-order difference operators $D_x^{rst}$, $D_y^{rst}$, and $D_z^{rst}$ obtained by smearing out $D_x$, $D_y$, and $D_z$ in two axis directions other than the differencing direction are defined at the differentiation defining positions by the following equation, $$D_x^{rst} = E_z^t(E_y^s D_x)$$

$$D_y^{rst} = E_x^r(E_z^t D_y)$$

$$D_z^{rst} = E_y^s(E_x^r D_z),$$

the operators $P_i$ (where I is 8 and i is an integer in the range of $1 \leq i \leq I$) are determined to correspond to 8 combinations of r, s, and t using $D_x^{rst}$, $D_y^{rst}$, and $D_z^{rst}$, and $a_i$ is $\frac{1}{8}$.

3. The method according to claim 1, wherein the analysis target space is a two-dimensional space having an x axis and a z axis as coordinate axes, and wherein when two-point first-order difference operators in the x axis direction and the z axis direction at differentiation defining positions are $D_x$ and $D_z$, second-order-accuracy zeroth order difference operators designed to have optimal accuracy at the differentiation defining positions by using three-point difference approximations in the x axis direction and the z axis direction are $E_x^r$ and $E_z^s$ (where r and s are 1 or 2 and denote types of the operators depending on a difference in location of the three discrete grid points used in the difference with respect to the differentiation defining positions), and first-order difference operators $D_x^{rs}$ and $D_x^{rs}$ obtained by smearing out $D_x$ and $D_z$ in axis directions other than the axis of a differencing direction are defined at the differentiation defining positions by the following equation, $$D_x^{rs} = E_z^s(D_x)$$

$$D_z^{rs} = E_x^r(D_z),$$

the operators $P_i$ (where I is 4 and i is an integer in the range of $1 \leq i \leq I$) are determined to correspond to 4 combinations of r and s using $D_x^{rs}$ and $D_z^{rs}$, and $a_i$ is $\frac{1}{4}$.

4. The method according to claim 2 or 3, wherein H' is generated on the basis of the following equation corrected using a spatial second order difference operator $Q_j$ (where j is an integer in the range of $1 \leq j \leq J$ and J is a natural number which depends on the dimensionality of the analysis target space), which operates on the state vectors, of the displacement vector at each discrete grid point, $$H' = \sum_i a_i P_i^T C P_i + \sum_j \epsilon_j Q_j^T C Q_j,$$

(where $\epsilon_j$ is a positive scalar coefficient, the operator $Q_j^T$ is a transposed matrix operator of the matrix representation of operator $Q_j$), and wherein $\epsilon_j$ is determined so that the coefficient of the fourth order term in the Taylor expansion at the differentiation defining position of H' is 0 or more.

5. The method according to claim 4, wherein when an error of T' relative to a theoretically exactly accurate operator $T^0$ denoting the mass matrix is $\delta T$, an error of H' with respect to a theoretically exactly accurate operator $H^0$ representing the stiffness matrix is $\delta H$, $u_m$ is an eigenvector of the theoretically exactly accurate equation of motion (where m is the identifying index of an eigenmode), an eigenfrequency corresponding to $u_m$ is $\omega_m$, and $\delta T_{mm}$ and $\delta H_{mm}$ denote diagonal components of the matrix elements of $\delta T$ and $\delta H$ with respect to the eigenvector, a diagonal matrix X is defined so that T' and H' approximately satisfy the equation $\omega_m^2 \delta T_{mm} - \delta H_{mm} = 0$ for all of the eigenmodes with second or higher order accuracy in terms of a spatial grid interval and $\delta T^{num}$ expressed by the following equation is generated, $$\delta T^{num} = \sum_i a_i P_i^T X P_i + \sum_j \epsilon_j Q_j^T X Q_j.$$

6. A system for processing seismic data that involves synthesizing the operators used in the predictor step and the corrector step on the basis of the following equation, which is an implicit finite difference approximation of the equation of motion, for a numerical analysis of seismic wave motion propagated in a finite region defined by an interior section of the earth which is carried out using a time-domain finite-difference method employing a predictor-corrector scheme, $$T' \frac{1}{\Delta t^2}(c_+ - 2c_0 + c_-) = -\frac{H'}{12}(c_+ + 10 c_0 + c_-) + f,$$

(where $\Delta t$ denotes a time step, $c_+$, $c_0$, and $c_-$ denote state vectors (which give components of the displacement vector at discrete grid points in an analysis target space) at times $t+\Delta t$, $t$, and $t-\Delta t$, respectively, f denotes an external force vector at each discrete grid point, T' denotes a mass matrix, and H' denotes a stiffness matrix), the system comprising a unit for generating operators H' and $\delta T^{num}$ (where T is a positive definite diagonal mass matrix) given by $\delta T^{num} = T' - T$, the residual of the mass matrix,
wherein H' is generated using a spatial first-order difference operator $P_i$ (where i is an integer in the range of $1 \leq i \leq I$ and I is a natural number which depends on a dimensionality of the analysis target space), which operates on the state vectors, at each discrete grid point, and an elastic constant matrix C on the basis of the following equation, $$H' = \sum_i a_i P_i^T C P_i,$$

(where $a_i$ is a positive scalar coefficient, the operator $P_i^T$ is an operator expressed as a transposed matrix of the matrix representing the operator $P_i$), and
wherein $\delta T^{num}$ is defined so that an operation result of the operator $\delta T^{num}$ on state vectors corresponding to rotations and translations is 0;
receiving the seismic data; and
using the operators generated to carry out the numerical analysis and to produce a model of the interior section of the earth.

7. The system according to claim 6, wherein the analysis target space is a three-dimensional space having an x axis, a y axis, and a z axis as coordinate axes, and
wherein when two-point first-order difference operators in the x axis direction, the y axis direction, and the z axis direction at differentiation defining positions are $D_x$, $D_y$, and $D_z$, second-order-accuracy zeroth order difference operators designed to have optimal accuracy at the differentiation defining positions by using three-point difference approximations in the x axis direction, the y axis direction, and the z axis direction are $E_x^r$, $E_y^s$, and $E_z^t$ (where r, s, and t are 1 or 2 and denote types of the operators depending on a difference in location of the three discrete grid points used in the difference with respect to the differentiation defining positions), and first-order difference operators $D_x^{rst}$, $D_y^{rst}$, and $D_z^{rst}$ obtained by smearing out $D_x$, $D_y$, and $D_z$ in the two coordinate axis directions other than the differencing direction are defined at the differentiation defining positions by the following equation, $$D_x^{rst} = E_z^t(E_y^s D_x)$$

$$D_y^{rst} = E_x^r(E_z^t D_y)$$

$$D_z^{rst} = E_y^s(E_x^r D_z),$$

the operators $P_i$ (where I is 8 and i is an integer in the range of $1 \leq i \leq I$) are determined to correspond to 8 combinations of r, s, and t using $D_x^{rst}$, $D_y^{rst}$, and $D_z^{rst}$, and $a_i$ is $\frac{1}{8}$.

8. The system according to claim 6, wherein the analysis target space is a two-dimensional space having an x axis and a z axis as coordinate axes, and
wherein when two-point first-order difference operators in the x axis direction and the z axis direction at differentiation defining positions are $D_x$ and $D_z$, second-order-accuracy zeroth order difference operators designed to have optimal accuracy at the differentiation defining positions by using three-point difference approximations in the x axis direction and the z axis direction are $E_x^r$ and $E_z^s$ (where r and s are 1 or 2 and denote types of the operators depending on a difference in location of the three discrete grid points used in the difference with respect to the differentiation defining positions), and first-order difference operators $D_x^{rs}$ and $D_z^{rs}$ obtained by smearing out $D_x$ and $D_z$ in axis directions other than the axis of a differencing direction are defined at the differentiation defining positions by the following equation, $$D_x^{rs} = E_z^s(D_x)$$

$$D_z^{rs} = E_x^r(D_z),$$

the operators $P_i$ (where I is 4 and i is an integer in the range of $1 \leq i \leq I$) are determined to correspond to 4 combinations of r and s using $D_x^{rs}$ and $D_z^{rs}$, and $a_i$ is $\frac{1}{4}$.

9. The system according to claim 7 or 8, wherein H' is generated on the basis of the following equation corrected using a spatial second-order difference operator $Q_j$ (where j is an integer in the range of $1 \leq j \leq J$ and J is a natural number which depends on the dimensionality of the analysis target space), which operates on the state vectors of the displacement vector at each discrete grid point, $$H' = \sum_i a_i P_i^T C P_i + \sum_j \epsilon_j Q_j^T C Q_j,$$

(where $\epsilon_j$ is a positive scalar coefficient, the operator $Q_j^T$ is an operator expressed as a transposed matrix of the matrix operator $Q_j$), and
wherein $\epsilon_j$ is determined so that the coefficient of the fourth order term in the Taylor expansion at the differentiation defining position of H' is 0 or more.

10. The system according to claim 9, wherein when an error of T' relative to a theoretically exact operator $T^0$ denoting the mass matrix is $\delta T$, an error of H' with respect to a theoretically exact operator $H^0$ representing the stiffness matrix is $\delta H$, $u_m$ is an eigenvector of the theoretically exact equation of motion (where m is the identifying index of an eigenmode), $\omega_m$ is an eigenfrequency corresponding to $u_m$, and $\delta T_{mm}$ and $\delta H_{mm}$ denote diagonal components of the matrix elements of $\delta T$ and $\delta H$ with respect to the eigenvector, a block diagonal matrix X is selected under the condition that T' and H' approximately satisfy the equation $\omega_m^2 \delta T_{mm} - \delta H_{mm} = 0$ for all eigenmodes with second or higher order accuracy of a spatial grid interval, and $\delta T^{num}$ given by the following equation is synthesized, $$\delta T^{num} = \sum_i a_i P_i^T X P_i + \sum_j \epsilon_j Q_j^T X Q_j.$$

11. A simulation device for processing seismic data that involves carrying out a numerical analysis of seismic wave motion propagated in a finite region defined by an interior section of the earth using a time-domain finite-difference method employing a predictor-corrector scheme, a simulation device comprising a computational unit for calculating a predictor step and a corrector step on the basis of the following equation, which is an implicit finite-difference approximation of the equation of motion using a positive definite diagonal mass matrix T, and an operator $\delta T^{num}$ expressed by $\delta T^{num} = T' - T$, the residual of the mass matrix, $$T' \frac{1}{\Delta t^2}(c_+ - 2c_0 + c_-) = -\frac{H'}{12}(c_+ + 10 c_0 + c_-) + f,$$

(where $\Delta t$ denotes a time step, $c_+$, $c_0$, and $c_-$ denote state vectors (which give components of the displacement vector at discrete grid points in an analysis target space) at times $t+\Delta t$, $t$, and $t-\Delta t$, respectively, f denotes an external force vector at each discrete grid point, T' denotes a mass matrix, and H' denotes a stiffness matrix), the predictor step being expressed by the following equation, $$T \frac{1}{\Delta t^2}(\tilde{c}_+ - 2c_0 + c_-) = -H' c_0 + f,$$

the corrector step being expressed by the following equation, $$T \frac{1}{\Delta t^2} \delta c_+ = -\frac{H'}{12}(\tilde{c}_+ - 2c_0 + c_-) - \delta T^{num} \frac{1}{\Delta t^2}(\tilde{c}_+ - 2c_0 + c_-),$$

the state vector $c_+$ at successive time steps is obtained using the following equation, $$c_+ = \tilde{c}_+ + \delta c_+,$$

wherein H' is an operator expressed by the following equation, from a spatial first-order difference operator $P_i$ (where i is an integer in the range of $1 \leq i \leq I$ and I is a natural number which depends on a dimensionality of an analysis target space), which operates on the state vectors of the displacement vector at each discrete grid point, and an elastic constant matrix C, $$H' = \sum_i a_i P_i^T C P_i,$$

(where $a_i$ is a positive scalar coefficient, the operator $P_i^T$ is a transposed matrix of the matrix operator $P_i$), and wherein the operator $\delta T^{num}$ is an operator designed so that an operation result of the operator $\delta T^{num}$ on the state vectors corresponding to rotations and translations is 0;
receiving the seismic data; and
using the predictor step and the corrector step calculated to carry out the numerical analysis and to produce a model of the interior section of the earth.

12. A simulation device according to claim 11, wherein the analysis target space is a three-dimensional space having an x axis, a y axis, and a z axis as coordinate axes, and
wherein when two-point first-order difference operators in the x axis direction, the y axis direction, and the z axis direction at differentiation defining positions are $D_x$, $D_y$, and $D_z$, second-order-accuracy zeroth order difference operators designed to have optimal accuracy at the differentiation defining positions by using three-point difference approximations in the x axis direction, the y axis direction, and the z axis direction are $E_x^r$, $E_y^s$, and $E_z^t$ (where r, s, and t are 1 or 2 and denote types of the operators depending on a difference in location of the three discrete grid points used in the difference with respect to the differentiation defining positions), and first-order difference operators $D_x^{rst}$, $D_y^{rst}$, and $D_z^{rst}$ obtained by smearing out $D_x$, $D_y$, and $D_z$ in two axis directions other than the differencing direction are defined at the differentiation defining positions by the following equation, $$D_x^{rst} = E_z^t(E_y^s D_x)$$

$$D_y^{rst} = E_x^r(E_z^t D_y)$$

$$D_z^{rst} = E_y^s(E_x^r D_z),$$

the stiffness matrix H' is generated using the operators $P_i$ (where I is 8 and i is an integer in the range of $1 \leq i \leq I$) determined to correspond to 8 combinations of r, s, and t using $D_x^{rst}$, $D_y^{rst}$, and $D_z^{rst}$ and using $a_i$ of ⅛.

13. A simulation device according to claim 11, wherein the analysis target space is a two-dimensional space having an x axis and a z axis as coordinate axes, and
wherein when two-point first-order difference operators in the x axis direction and the z axis direction at differentiation defining positions are $D_x$ and $D_z$, second-order-accuracy zeroth order difference operators designed to have optimal accuracy at the differentiation defining positions by using three-point difference approximations in the x axis direction and the z axis direction are $E_x^r$ and $E_z^s$ (where r and s are 1 or 2 and denote types of the operators depending on a difference in location of the three discrete grid points used in the difference with respect to the differentiation defining positions), and first-order difference operators $D_x^{rs}$ and $D_z^{rs}$ obtained by smearing out $D_x$ and $D_z$ in axis directions other than the axis of a differentiation direction are defined at the differentiation defining positions by the following equation, $$D_x^{rs} = E_z^s(D_x)$$

$$D_z^{rs} = E_x^r(D_z),$$

the stiffness matrix H' is generated using the operators $P_i$; (where I is 4 and i is an integer in the range of $1 \leq i \leq I$) determined to correspond to 4 combinations of r and s using $D_x^{rs}$ and $D_z^{rs}$ and using $a_i$ of ¼.

14. A simulation device according to claim 12 or 13, wherein H' is an operator expressed by the following equation corrected using a spatial second order difference operator $Q_j$ (where j is an integer in the range of $1 \leq j \leq J$ is a natural number which depends on the dimensionality of the analysis target space), which operates on the state vectors of the displacement vector at each discrete grid point, $$H' = \sum_i a_i P_i^T C P_i + \sum_j \epsilon_j Q_j^T C Q_j,$$

(where $\epsilon_j$ is a positive scalar coefficient, the operator $Q_j^T$ is a transposed matrix operator of the matrix representation of the operator $Q_j$), and wherein $\epsilon_j$ is determined so that the coefficient of the fourth order term in the Taylor expansion at the differentiation defining position of H' is 0 or more.

15. A simulation device according to claim 14, wherein when an error of T' relative to a theoretically exact mass matrix operator is $\delta T$, an error of H' with respect to a theoretically exact stiffness matrix operator $H^0$ is $\delta H$, an eigenvector of the theoretically exact equation of motion is $u_m$ (where m is the identifying index of an eigenmode), $\omega_m$ is an eigenfrequency corresponding to $u_m$, and $\delta T_{mm}$ and $\delta H_{mm}$ denote diagonal components of the matrix elements of $\delta T$ and $\delta H$ with respect to the m-th eigenvector, T' and H' approximately satisfy the equation $\omega_m^2 \delta T_{mm} - \delta H_{mm} = 0$ for all the eigenmodes with second or higher order accuracy in a spatial grid interval, and $\delta T^{num}$ is given by the following equation using a block diagonal matrix X, $$\delta T^{num} = \sum_i a_i P_i^T X P_i + \sum_j \epsilon_j Q_j^T X Q_j.$$

* * * * *